United States Patent [19]
Koike

[11] Patent Number: 5,337,282
[45] Date of Patent: Aug. 9, 1994

[54] DYNAMIC RANDOM ACCESS MEMORY DEVICE WITH REFRESHING SYSTEM POWERED WITH EXTERNAL POWER SOURCE IN TRIMMING STAGE INSTEAD OF BUILT-IN STEP-DOWN CIRCUIT

[75] Inventor: Hiroki Koike, Tokyo, Japan
[73] Assignee: NEC Corporation, Tokyo, Japan
[21] Appl. No.: 95,200
[22] Filed: Jul. 23, 1993
[30] Foreign Application Priority Data
Jul. 28, 1992 [JP] Japan .................................. 4-222034
[51] Int. Cl.$^5$ ........................ G11C 7/00; G11C 11/40
[52] U.S. Cl. ..................................... 365/222; 365/201; 365/228
[58] Field of Search ............... 365/222, 201, 226, 227, 365/228

[56] References Cited

U.S. PATENT DOCUMENTS

| | | | |
|---|---|---|---|
| 4,688,196 | 8/1987 | Inagaki et al. | 365/227 |
| 4,807,196 | 2/1989 | Mizukami | 365/201 |
| 5,144,585 | 9/1992 | Min et al. | 365/201 |
| 5,153,452 | 10/1992 | Iwamura et al. | 365/226 |
| 5,270,982 | 12/1993 | Watanabe | 365/222 |

OTHER PUBLICATIONS

Tohru Furuyama et al., "A New On-Chip Voltage Converter for Submicrometer High-Density DRAM's", IEEE Journal of Solid-State Circuits, vol. SC-22, No. 3, Jun. 1987, pp. 437-441.

Primary Examiner—Eugene R. LaRoche
Assistant Examiner—Tan Nguyen
Attorney, Agent, or Firm—Sughrue, Mion, Zinn, Macpeak & Seas

[57] ABSTRACT

A dynamic random access memory device periodically refreshes data bits stored in the memory cells, and a refreshing system is incorporated in the dynamic random access memory device for incrementing a refresh address, wherein the refreshing system comprises an oscillator powered with a step-down voltage in the refreshment and with an external power voltage through a testing operation in a diagnostic mode, a clock generating unit for producing a clock signal defining an interval of each refreshing sequence, and a refresh address counter for producing an internal address signal indicative of the refresh address so that the frequency of a pulse signal produced by the oscillator is regulable without any influence of non-regulated step-down voltage.

7 Claims, 6 Drawing Sheets

DYNAMIC RANDOM ACCESS MEMORY DEVICE WITH REFRESHING SYSTEM POWERED WITH EXTERNAL POWER SOURCE IN TRIMMING STAGE INSTEAD OF BUILT-IN STEP-DOWN CIRCUIT

FIELD OF THE INVENTION

This invention relates to a dynamic random access memory device and, more particularly, to a dynamic random access memory device with a refreshing system powered with an external power source in a diagnosis instead of a built-in step-down circuit.

DESCRIPTION OF THE RELATED ARTS

The dynamic type random access memory device has a plurality of memory cells each usually implemented by a series combination of a switching transistor and a storage capacitor, and stores data bits in the form of electric charge. However, the charge current is liable to flow out from the storage capacitors, and the data bits are periodically refreshed for preventing the memory cells from loss of the data bits. The refreshment is, therefore, indispensable to the dynamic type random access memory device, and some dynamic random access memory devices carry out an automatic refreshing function in a refreshing mode of operation.

A typical example of the dynamic random access memory device with the automatic refreshing function is illustrated in FIG. 1 of the drawings, and is fabricated on a single semiconductor chip 1. The dynamic random access memory device largely comprises a memory cell array 2, an addressing system 3, a data propagation system 4, a controlling system 5, a power distribution system 6 and an automatic refreshing system 7. The dynamic random access memory device selectively enters a standard mode and a refreshing mode, and one of the addressing system 3 and the refreshing system 7 is used for the memory cell array 1 depending upon the mode of operation.

The memory cell array 2 is constituted by a plurality of addressable memory cells, and small bubbles are representative of the addressable memory cells. Each memory cell is implemented by a series circuit of an n-channel enhancement type switching transistor and a storage capacitor, and a data bit is stored therein in the form of electric charge. The amount of electric charge packet is corresponding to the logic level of the data bit. A plurality of word lines WL1, WL2, WLl and WLm are selectively coupled with the gate electrodes of the n-channel enhancement type switching transistors incorporated in the addressable memory cells, and a plurality of bit line pairs BLP1 to BLPn are further selectively coupled with the drain nodes of the n-channel enhancement type switching transistors. Therefore, each of the memory cells is selected from the memory cell array for access with the word lines WL1 to WLm and the bit line pairs BLP1 to BLPn. The word lines WL1 to WLm are respectively assigned row addresses, and column addresses are respectively assigned to the bit line pairs BLP1 to BLPn. In the standard mode of operation, the addressing system 3 selects one of the word lines WL1 to WLm and one of the bit line pairs BLP1 to BLPn, and, hence, one of the memory cells becomes accessible.

The addressing system 3 comprises a row address buffer unit 3a, a column address buffer unit 3b, a row address decoder/word line driver unit 3c and a column address decoder/column selector unit 3d. Address pins are shared between the row address buffer unit 3a and the column address buffer unit 3b, and the row address buffer unit 3a and the column address buffer unit 3b respectively latch the row address bits and the column address bits in response to internal timing control signals from the controlling system 5. The row address buffer unit 3a and the column address buffer unit 3b respectively produce row address predecoded signals and column address predecoded signals, and supply the row address predecoded signals and the column address predecoded signals to the row address decoder/word line driver unit 3c and to the column address decoder/column selector unit 3d, respectively.

The row address decoder/word line driver unit 3c is responsive to the row address predecoded signals, and drives one of the word lines WL1 to WLm so as to allow the n-channel enhancement type switching transistors of the selected memory cells to conduct the associated storage capacitors with the bit line of the associated pairs. The electric charge packets in the storage capacitors produce potential differences on the bit line pairs in a read-out phase of both standard and refreshing modes, and the storage capacitors store or restore electric charge packets indicative of data bits in a write-in phase of both standard and refreshing mode.

The column address decoder/column selector unit 3d is responsive to the column address predecoded signals, and couples one of the bit line pairs BLP1 to BLPn with a data bus DL in both read-out and write-in phases of the standard mode. However, the column address decoder/column selector unit 3d stands idle in the refreshing mode of operation.

The data bus DL is coupled with an input/output data buffer unit 4a, and the input/output data buffer unit 4a produces an output data signal from the potential difference on the data bus DL in the read-out phase of the standard mode and a potential difference on the data bus DL from an input data signal in the write-in phase of the standard mode. The bit line pairs BLP1 to BLPn, the data bus DL and the input/output data buffer unit 4a form in combination the data propagation system 4.

The controlling system 5 comprises a timing generating unit 5a and a switching unit 5b. The timing generating unit 5a is responsive to external control signals in the standard mode and to an internal clock signal ICL in the refreshing mode, and sequentially produces internal timing control signals. The internal clock signals provide appropriate timings for a precharging stage, a latching stage of the row address signal, a sense amplification stage, a latching stage of the column address signal and a data input/output stage, by way of example.

The switching unit 5b is responsive to a mode shifting signal from a timer unit (not shown), and selectively couples the refreshing system 7 and the row address buffer unit 3a with the row address decoder/word line driver unit 3c. Namely, if both row and column address strobe signals are maintained in the active low voltage level for 100 micro-seconds, the dynamic random access memory device enters the self-refreshing mode, and the mode shifting signal is produced. With the mode shifting signal from the timer, the refreshing system 7 supplies an refresh address to the row address decoder/word line driver unit 3c and an internal clock signal ICL to the timing generating unit 5a, and controls the read-out phase followed by the write-in phase in the refreshing mode of operation without any supply of data bits from and to the outside of the device.

The power distribution system 6 comprises a power stabilizer 6a coupled with a power supply pin, and a power distribution network 6b. An external power voltage Vcc is supplied from the power supply pin to the power stabilizer 6, and the stabilized power voltage level is distributed to the systems.

The refreshing system 7 comprises an oscillator 7a, a clock generating unit 7b and a refresh address counter unit 7c. The oscillator 7a is powered with the power distribution network 6b, and produces clock pulses. The memory cells loses the data bits due to the leakage charge packets, and all of the memory cells should be periodically refreshed while the logic level of every data bit is still discriminative. The clock generating unit 7b produces the internal clock signal from the clock pulses at appropriate intervals for the refreshment, and the internal clock signal ICL is supplied to the refresh address counter unit 7c and to the timing generating unit 5a. The refresh address counter unit 7c is responsive to the internal clock signal ICL for sequentially incrementing the refresh address, and produces a refresh address signal indicative of the refresh address. The timing generating unit 5a produces parts of the internal control signals for some stages necessary for the refreshment.

The oscillator 7a incorporated in the prior art dynamic random access memory device thus arranged is subjected to a trimming for regulating the intervals to the appropriate value before delivery from the manufacturing factory, because the frequency of the oscillator 7a is not constant over the products due to fluctuation of process parameters. In detail, if the intervals are too long to keep the data bits discriminative, the data bits stored therein are not reliable, and the dynamic random access memory device should be discarded as a defective product. On the other hand, if the intervals are too short, electric power consumption in the refreshing mode exceeds a guaranteed range, and such a large current consumed product should be also discarded as a defective product.

The oscillation frequency directly relates to the intervals, and the manufacturer measures the oscillation frequency under application of the external power voltage to see whether or not the oscillation frequency is fallen into a predetermined range. Even if the oscillation frequency is out of the predetermined range, a trimming rescues the defective products. A laser trimming is carried out on the oscillator 7a, and the manufacturer tries to regulate the oscillation frequency to the target value. The laser trimming on the oscillator 7a is not difficult, because the oscillator 7a operates under the actual power voltage level identical with the refreshing cycle after the delivery.

However, it is not easy to carry out the laser trimming on an oscillator incorporated in a dynamic random access memory device equipped with a built-in step down circuit as shown in FIG. 2. The dynamic random access memory device shown in FIG. 2 is equipped with an on-chip voltage converter 10, and an external power voltage is applied from a power supply pin 17 to the on-chip voltage converter 10. The external power voltage steps down through the on-chip voltage converter 10, and the step-down power voltage Vint is distributed to memory cell arrays ]2 and peripheral circuits 13.

In the dynamic random access memory device thus arranged, a refreshing system is also powered with the step-down voltage, and the oscillation frequency is measured under application of the step-down voltage. However, the on-chip voltage converter 10 is liable to be affected by fluctuation of process parameters, and the step-down power voltage is not constant over the products. For this reason, the manufacturer measures the step-down voltage to see whether to regulate or not, and the step-down voltage is regulated through a laser trimming before delivery from the manufacturing factory.

If the prior art dynamic random access memory device is equipped with the automatic refreshing system powered with the on-ship voltage converter, not only the oscillator incorporated in the automatic refreshing system but also the on-ship voltage converter are subjected to the trimming operations, and the laser trimming on the oscillator should be later than the laser trimming on the on-chip voltage converter, because the laser trimming under a non-regulated step-down power voltage is nonsense. As a result, the manufacturer repeats the laser trimming twice, and such a repeated regulation increases the production cost.

SUMMARY OF THE INVENTION

It is therefore an important object of the present invention to provide a dynamic random access memory device which is equipped with an automatic refreshing system powered with a built-in step-down circuit both simultaneously regulated through a trimming operation.

To accomplish the object, the present invention proposes to regulate a frequency of a pulse signal under application of a power voltage with a known level.

In accordance with the present invention, there is provided a dynamic random access memory device selectively entering a diagnostic mode, a standard mode for a data access and a refreshing mode, comprising: a) a plurality of memory cells respectively assigned individual addresses, and respectively storing data bits in the form of electric charge; b) an addressing system associated with the plurality of memory cells, and responsive to external address bits for selectively carrying out a read-out sequence and a write-in sequence on the plurality of memory cells in the standard mode; c) a refreshing system associated with the plurality of memory cells, and operative to sequentially refresh the data bits stored in the plurality of memory cells through a refreshing sequence in the refreshing mode, the refreshing system having an oscillator operative to produce a pulse signal used for defining an interval of the refreshing sequence, a frequency of the pulse signal being detectable at the outside thereof and regulable in a first testing operation in the diagnostic mode; and d) a power distribution system having a voltage converter operative to produce a first power voltage with an unknown level from an second power voltage with a known level, and supplying the first power voltage to at least the oscillator in the refreshing mode and the second power voltage to at least the oscillator in the first testing operation, the unknown level of said first power voltage being detectable and regulable through a second testing operation in the diagnostic mode.

BRIEF DESCRIPTION OF THE DRAWINGS

The features and advantages of the dynamic random access memory device according to the present invention will be more clearly understood from the following description taken in conjunction with the accompanying drawings in which.

DESCRIPTION OF THE PREFERRED EMBODIMENTS

First Embodiment

Figure 1:
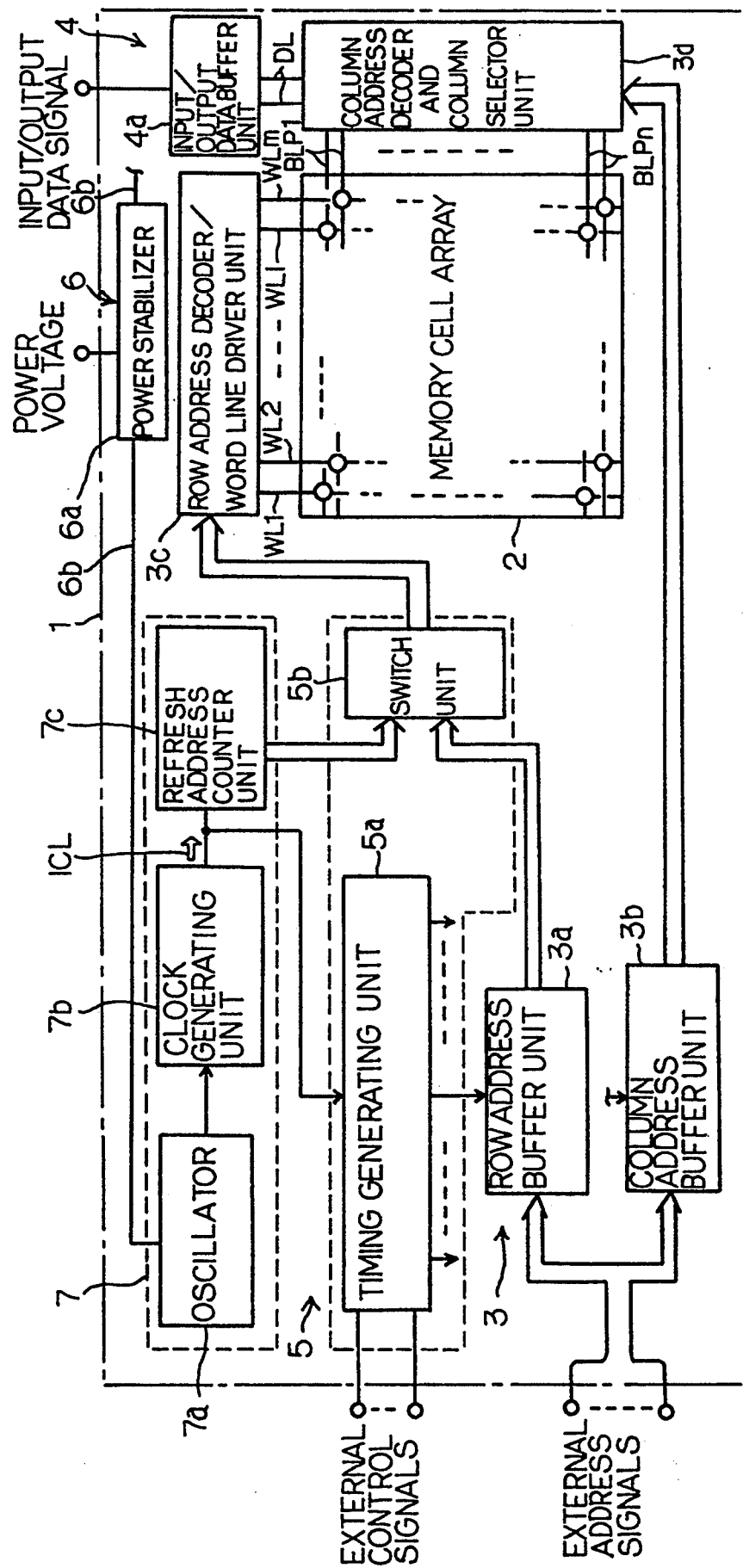
FIG. 1 is a block diagram showing the circuit arrangement of the prior art dynamic random access memory device equipped with the automatic refreshing system powered with the external power voltage level.
Figure 2:
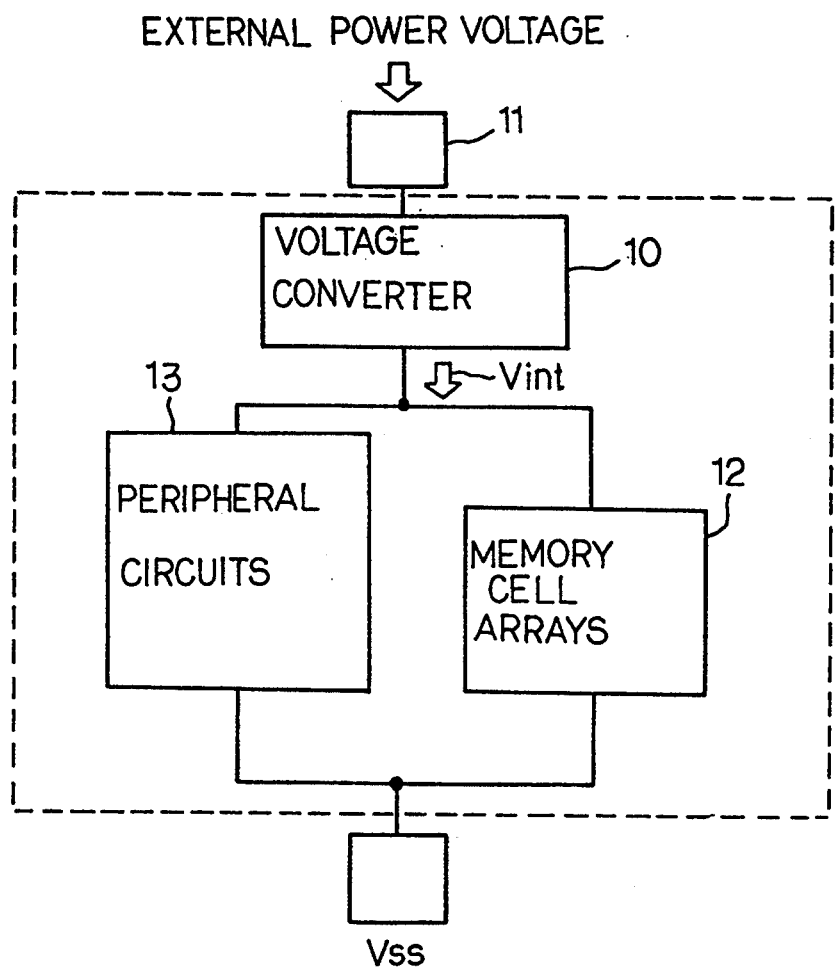
FIG. 2 is a block diagram showing the power distribution system incorporated in the other prior art dynamic random access memory device.
Figure 3:
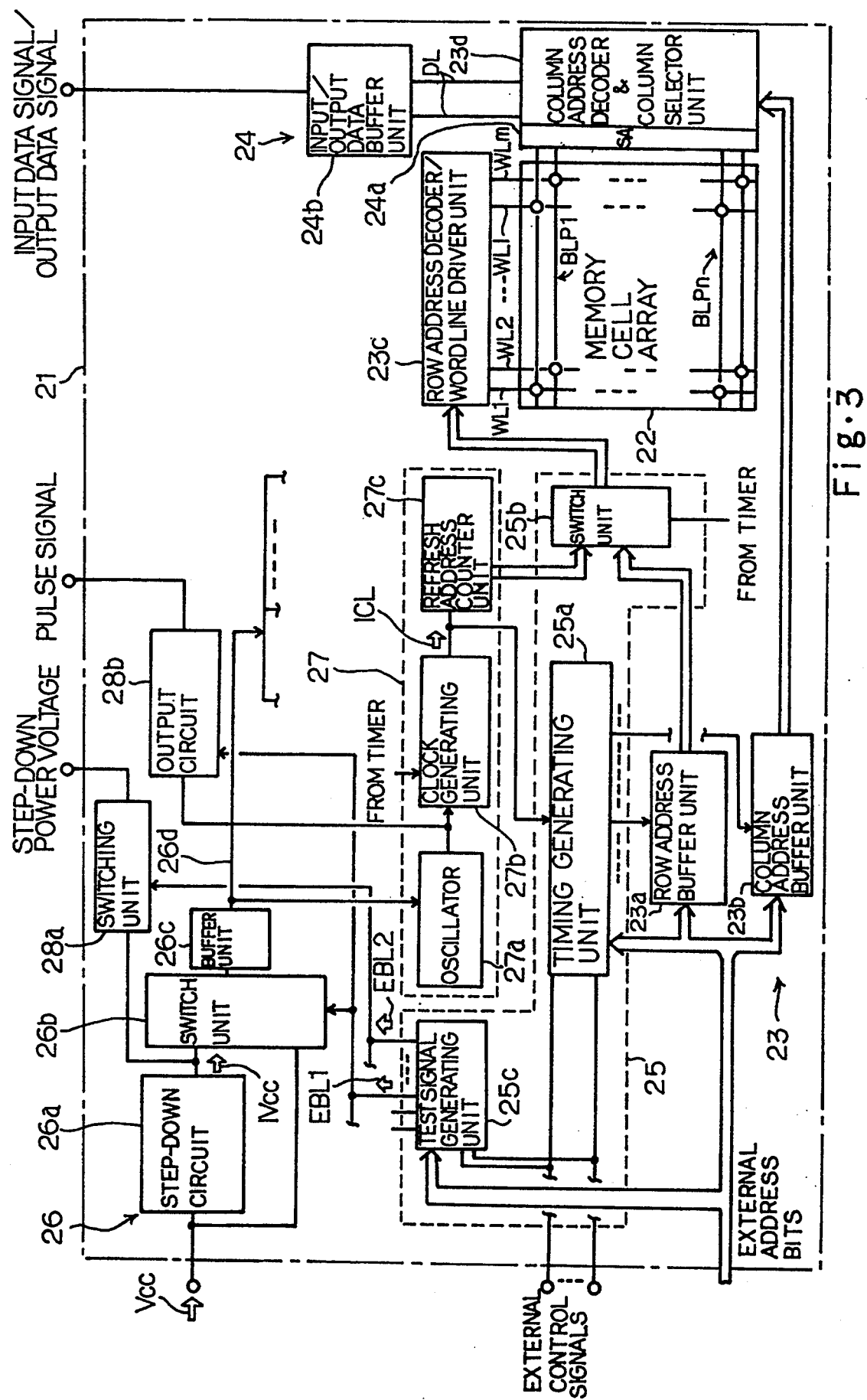
FIG. 3 is a block diagram showing the circuit arrangement of a dynamic random access memory device according to the present invention.

Referring to FIG. 3 of the drawings, a dynamic random access memory device embodying the present invention is fabricated on a semiconductor chip 21, and largely comprises a memory cell array 22, an addressing system 23, a data propagation system 24, a controlling system 25, a power distribution system 26 and an automatic refreshing system 27. The dynamic random access memory device selectively enters a standard mode and a refreshing mode after installation in an electronic system, and the addressing system 23 and the automatic refreshing system 27 are used in the standard mode and the refreshing mode, respectively. However, the dynamic random access memory device is subjected to a diagnosis upon completion of a fabrication process, and some circuit components are regulated for rescuing from rejection, if necessary.

The memory cell array 22 is constituted by a plurality of addressable memory cells arranged in rows and columns, and small bubbles are representative of the addressable memory cells, respectively. Each memory cell is implemented by a series circuit of an n-channel enhancement type switching transistor and a storage capacitor, and a data bit is stored therein in the form of electric charge. The amount of electric charge is corresponding to the logic level of the data bit stored therein.

A plurality of word lines WL1, WL2, WL1 and WLm are selectively associated with the rows of addressable memory cells, and each of the word lines WL1 to WLm are connected with the gate electrodes of the n-channel enhancement type switching transistors incorporated in the addressable memory cells in the associated row.

A plurality of bit line pairs BLP1 to BLPn are further associated with the columns of addressable memory cells, and each bit line pair is connected with the drain nodes of the n-channel enhancement type switching transistors of the addressable memory cells in the associated column. Therefore, each of the memory cells is selected from the memory cell array 22 for access with the word lines WL1 to WLm and the bit line pairs BLP1 to BLPn. The word lines WL1 to WLm are respectively assigned row addresses, and column addresses are respectively assigned to the bit line pairs BLP1 to BLPn. In the standard mode of operation, the addressing system 23 selects one of the word lines WL1 to WLm and one of the bit line pairs BLP1 to BLPn, and, accordingly, one of the memory cells becomes accessible.

The addressing system 23 comprises a row address buffer unit 23a, a column address buffer unit 23b, a row address decoder/word line driver unit 23c and a column address decoder/column selector unit 23d.

Address pins are shared between the row address buffer unit 23a and the column address buffer unit 23b, and the row address buffer unit 23a and the column address buffer unit 23b respectively latch the row address bits and the column address bits in response to internal timing control signals from the controlling system 25. The row address buffer unit 23a and the column address buffer unit 23b respectively produce row address predecoded signals and column address predecoded signals, and supply the row address predecoded signals and the column address predecoded signals to the row address decoder/word line driver unit 23c and to the column address decoder/column selector unit 23d, respectively.

The row address decoder/word line driver unit 23c is responsive to the row address predecoded signals, and drives one of the word lines WL1 to WLm so as to allow the n-channel enhancement type switching transistors of the selected memory cells to conduct the associated storage capacitors with the bit lines of the pairs BLP1 to BLPn.

The electric charge packets in the storage capacitors produce potential differences on the bit line pairs BLP1 to BLPn in a read-out phase of both standard and refreshing modes, and the storage capacitors store or restore electric charge packets indicative of data bits in a write-in phase of both standard and refreshing mode.

The column address decoder/column selector unit 23d is responsive to the column address predecoded signals, and connects one of the bit line pairs BLP1 to BLPn with a data bus DL in both read-out and write-in phases of the standard mode. However, the column address decoder/column selector unit 3d stands idle in the refreshing mode of operation.

The bit line pairs BLP1 to BLPn are connected with an array of sense amplifier circuits 24a, and the sense amplifier circuits 24a rapidly increase the potential differences on the bit line pairs BLP1 to BLPn before the transmission of a selected data bit to the data bus DL.

The data bus DL is connected with an input/output data buffer unit 24b, and the input/output data buffer unit 24b produces an output data signal from the potential difference on the data bus DL in the read-out phase of the standard mode and a potential difference on the data bus DL from an input data signal in the write-in phase of the standard mode. The bit line pairs BLP1 to BLPn, the sense amplifier circuits 24a, the data bus DL and the input/output data buffer unit 24b form in combination the data propagation system 24.

The controlling system 25 comprises a timing generating unit 25a, a switching unit 25b and a test signal generating unit 25c. The timing generating unit 25a is responsive to external control signals in the standard mode for sequentially producing internal control signals after change of the address bits, and a read-out sequence and a write-in sequence are controlled with the internal control signals. The internal clock signals provide appropriate timings for a precharging stage, a latching stage of the row address signal, a sense amplification stage, a latching stage of the column address signal and a data input/output stage, by way of example.

The timing generating unit 25a is further responsive to an internal clock signal ICL in the refreshing mode, and controls a refreshing sequence in the refreshing mode of operation. While carrying out the refreshing sequence, the internal control signals, by way of example, control the precharging stage and the sense amplification stage.

The switching unit 25b is responsive to a mode shifting signal from a timer unit (not shown) incorporated in the refreshing system 27, and selectively supplies a row address indicated by the row address predecoded signals and a refresh address to the row address decoder/word line driver unit 23c. In detail, if both of the row address strobe signal and the column address strobe signal go down to the active low voltage level and are maintained for 100 micro-seconds, the dynamic random access memory device enters the refreshing mode, and produces the mode shifting signal. The refreshing system 27 further supplies the internal clock signal ICL to the timing generating unit 25a, and the refreshing sequence is carried out with the refreshing address and the internal control signals.

The test signal generating unit 25c is used for the diagnostic operations, and the combination of predetermined address bits specifies one of the diagnostic operations. Namely, some of the external control signals allow the test signal generating unit 25c to enter the diagnosis, and the test signal generating unit 25c discriminates one of the diagnostic operations to be requested on the basis of the predetermined address bits. After the discrimination, in order to carry out the requested diagnostic operation, the test signal generating unit 25c selectively produces test enable signals.

The power distribution system 26 comprises an internal step-down voltage generating circuit 26a, a switching unit 26b, a buffer unit 26c and a power distribution network 26d. An external power voltage Vcc is supplied from the power supply pin to the step-down voltage generating circuit 26a, and the step-down voltage generating circuit 26a produces a step-down power voltage IVcc from the external power voltage Vcc. The step-down power voltage IVcc is regulable through a laser trimming. The step-down voltage generating circuit 26a and the power supply pin connected in parallel with the switching unit 26b, and the switching unit 26b is responsive to one of the test enable signals EBL1 for selectively connecting the step-down voltage generating circuit 26a and the power supply pin with the buffer unit 26c. In the standard mode, the external power voltage Vcc is supplied through the power supply pin to the step-down power voltage generating circuit 26a. However, an external power voltage IV'cc approximately equal to the step-down power voltage is supplied through the power supply pin to the switching unit 26b. The buffer unit 26c keeps the step-down power voltage IVcc constant, and supplies the step-down power voltage IVcc to the power distribution network 26d. The power distribution network 26d distributes the step-down power voltage IVcc and the external power voltage Vcc to predetermined component units. This does not mean that all of the component units are powered with either step-down or external power voltage, and the external power voltage Vcc and the step-down power voltage may be selectively supplied through two power distribution sub-networks to the component units.

Figure 4:
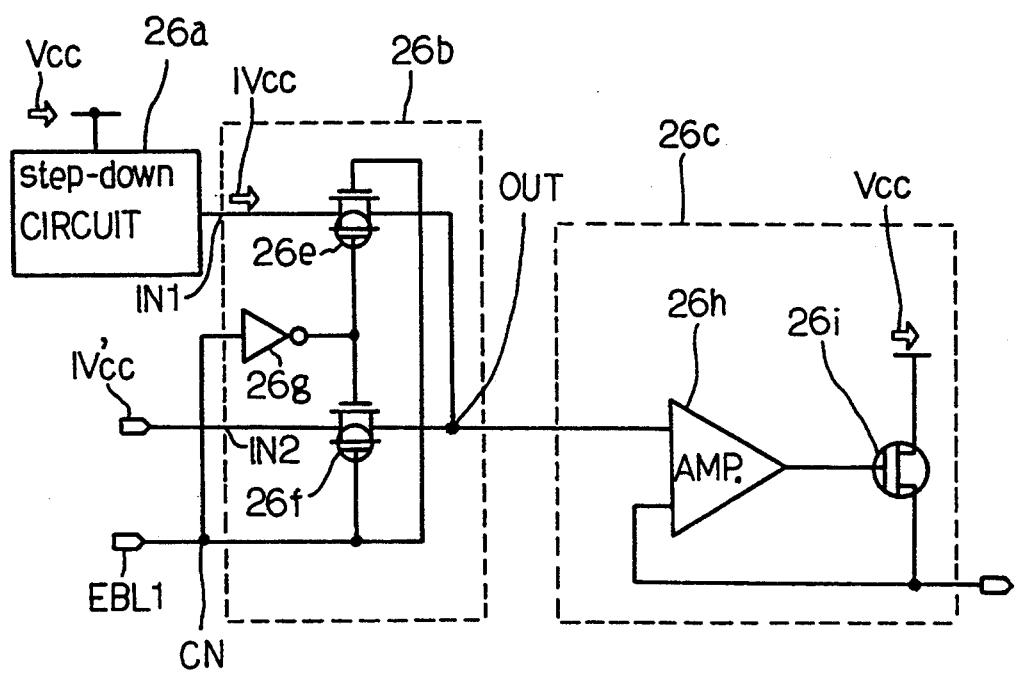
FIG. 4 is a circuit diagram showing a switching unit accompanied by a buffer unit incorporated in the dynamic random access memory device according to the present invention.

Turning to FIG. 4 of the drawings, the switching unit 26b comprises two transfer gates 26e and 26f connected between two input nodes IN1 and IN2 and an output node OUT and an inverter 26g connected a control node CN and the two transfer gates 26e and 26f. Each of the transfer gates 26e and 26f is implemented by a parallel combination of a p-channel enhancement type switching transistor and an n-channel enhancement type switching transistor. The control node CN directly supplies the test enable signal EBL1 to the gate electrode of the n-channel enhancement type switching transistor of the transfer gate 26e and to the gate electrode of the p-channel enhancement type switching transistor of the other transfer gate 26f, and the inverter 26g supplies the complementary signal of the test enable signal EBL1 to the gate electrode of the p-channel enhancement type switching transistor of the transfer gate 26e and to the gate electrode of the n-channel enhancement type switching transistor of the other transfer gate 26f. For this reason, one of the transfer gates 26e and 26f turns on so that either step-down or external power voltage IVcc or IV'cc is transferred to the output node OUT.

The buffer unit 26c comprises a differential amplifier circuit 26h connected at one input node thereof with the output node OUT of the switching unit 26b, and a p-channel enhancement type variable load transistor 26i connected between an external power voltage line for the external power voltage Vcc and the output node of the differential amplifier circuit 26h. The drain node of the p-channel enhancement type variable load transistor 26i is connected with the other input node of the differential amplifier circuit 26h, and the differential amplifier circuit 26h allows the p-channel enhancement type variable load transistor 26i to regulate the voltage level at the drain node thereof to the voltage level at the output node OUT of the switching unit 26b. In other words, if the step-down power voltage IVcc is transferred to the output node OUT, the p-channel enhancement type variable load transistor 26i regulates the voltage level at the drain node thereof to the step-down power voltage level IVcc. On the other hand, if the switching unit 26b transfers the external power voltage level IV'cc to the output node thereof, the p-channel enhancement type variable load transistor 26i regulates the voltage level at the drain node thereof to the external power voltage level IV'cc.

Turning back to FIG. 3, the step-down voltage generating circuit 26a is connected with another switching unit 28a, and the switching unit 28a is responsive to another test enable signal EBL2 indicative of a testing operation on the step-down voltage generating circuit 26a. In the testing operation identified by the test enable signal EBL2, the switching unit 28a turns on, and the step-down power voltage IVcc is transferred to one of the pins.

The refreshing system 27 comprises an oscillator 27a, a clock generating unit 27b and a refresh address counter unit 27c. The oscillator 27a is powered with the power distribution network 26c, and produces clock pulses. The frequency of clock pulses is regulable through a laser trimming. The clock pulses are supplied to the clock generating unit 27b, and the clock generating unit 27b produces the internal clock signal ICL from the clock pulses at appropriate intervals for the refreshment. The internal clock signal ICL is supplied to the refresh address counter unit 27c, and the refresh address counter unit 27c increments the refresh address. The internal clock signal ICL is further supplied to the timing generating unit 25a, and the internal clock signal ICL starts the refreshing sequence. The oscillator 27a is further connected with an output circuit 28b, and the output circuit 28b is responsive to the test enable signal EBL1 for transferring the clock pulses from the oscillator 27a to a pin in the testing operation on the oscillator 27a.

Description is hereinbelow made on circuit behaviors of the dynamic random access memory device. The dynamic random access memory device selectively enters the standard mode for writing and reading a data bit from the memory cell array 22, the refreshing mode for the data bits stored in the memory cell array 22 and a diagnostic mode for test operations before delivery from the manufacturing factory. The read-out sequence and the write-in sequence in the standard mode and the refreshing sequence in the refreshing mode are well known to a person skilled in the art, and no further description is incorporated hereinbefore.

One of the testing operations is carried out on the step-down voltage generating circuit 26a, and checks the step-down voltage generating circuit 26a to see whether to regulate the step-down power voltage IVcc through the laser trimming or not. The predetermined pin is connected with a diagnostic system, and the external control signals and the predetermined address bits cause the test signal generating unit 25c to produce the test enable signal EBL2, and the switching unit 28a turns on to transfer the step-down power voltage IVcc to the pin. Then, the diagnostic system compares the step-down power voltage IVcc with a target range, and determines that the step-down voltage generating circuit 26a should be subjected to the laser trimming or not.

Another testing operation is carried out on the oscillator 27a to see whether to regulate the oscillation frequency or not through the laser trimming. The diagnostic system changes the bit string of the predetermined address bits, and the test signal generating unit 25c supplies the test enable signal EBL1 to the switching unit 26b and the output circuit 28b. The switching unit 26b transfers the external power voltage IV'cc to the oscillator 27a, and the oscillator 27a starts producing the pulse signal. The pulse signal passes through the output circuit 28b, and the diagnostic system checks the oscillation frequency to see whether or not the oscillator 27a should be subjected to the laser trimming. Since the step-down power voltage IVcc may vary through the laser trimming, the step-down power voltage is unknown. However, the external power voltage IV'cc is known to the manufacturer, and the oscillation frequency at a target step-down power voltage IVcc is exactly estimated on the basis of the oscillation frequency at the external power voltage level IV'cc.

Assuming now that the diagnostic system determines that both step-down voltage generating circuit and oscillator should be subjected to the laser trimming. The dynamic random access memory device is placed on a laser trimmer, and not only the step-down voltage generating circuit 26a but also the oscillator 27a are simultaneously subjected to the laser trimming. As a result, the production cost is decreased.

Second Embodiment

Figure 5:
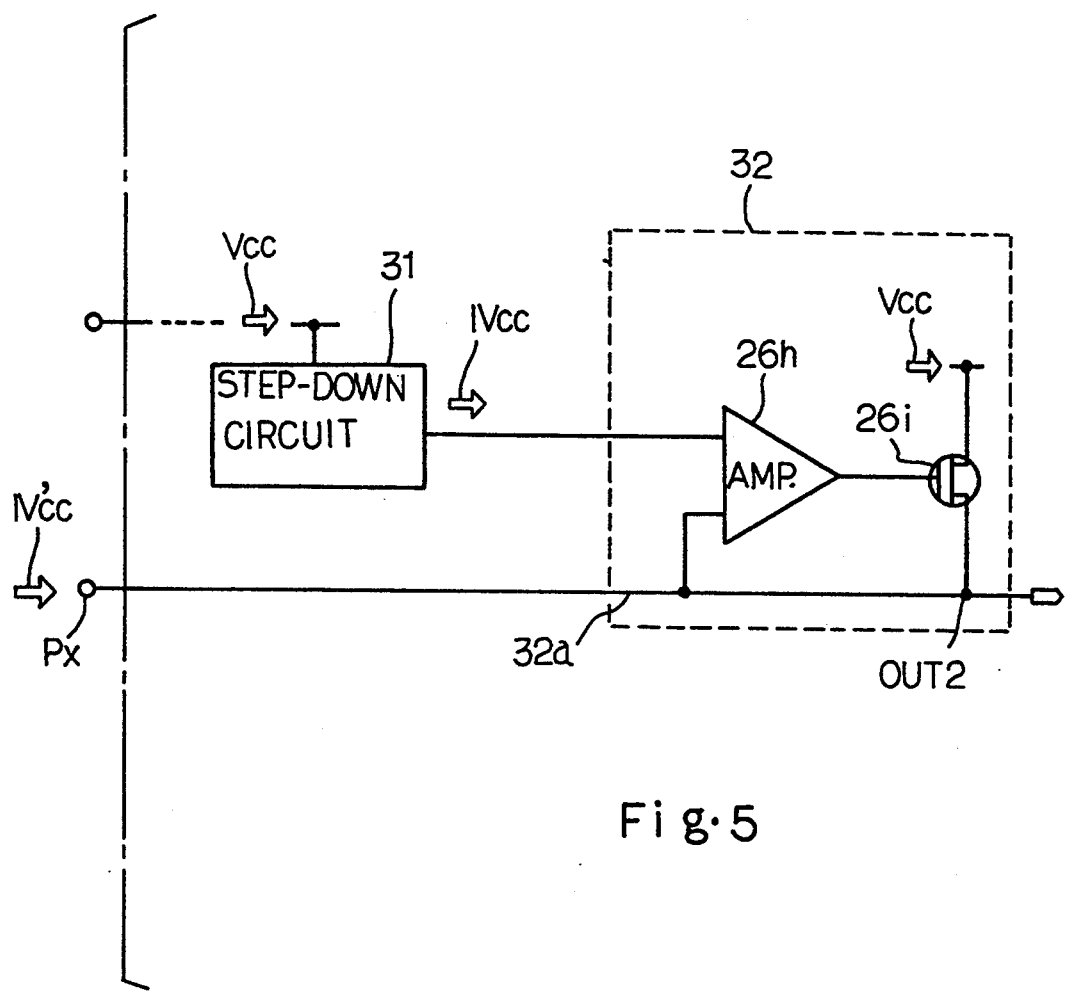
FIG. 5 is a circuit diagram showing a power distribution system incorporated in another dynamic random access memory device according to the present invention.

Turning to FIG. 5 of the drawings, a power distributing system incorporated in another dynamic random access memory device embodying the present invention comprises a step-down voltage generating circuit 31 and a buffer unit 32, and the dynamic random access memory device is similar to the buffer unit 26c except for a power voltage line 32a connected between the output node OUT2 of the buffer unit 32 and a predetermined pin Px not used in the standard mode and the refreshing mode. For this reason, no further description is made on the other components for avoiding repetition.

While a testing operation is carried out on the oscillator 27a, a known voltage level IV'cc is applied to the power voltage line 32a, and the oscillator 27a is examined to see whether or not the oscillation frequency is fallen into a target range. The know voltage level may be regulated to a target level of the internal step-down power voltage.

Third Embodiment

Figure 6:
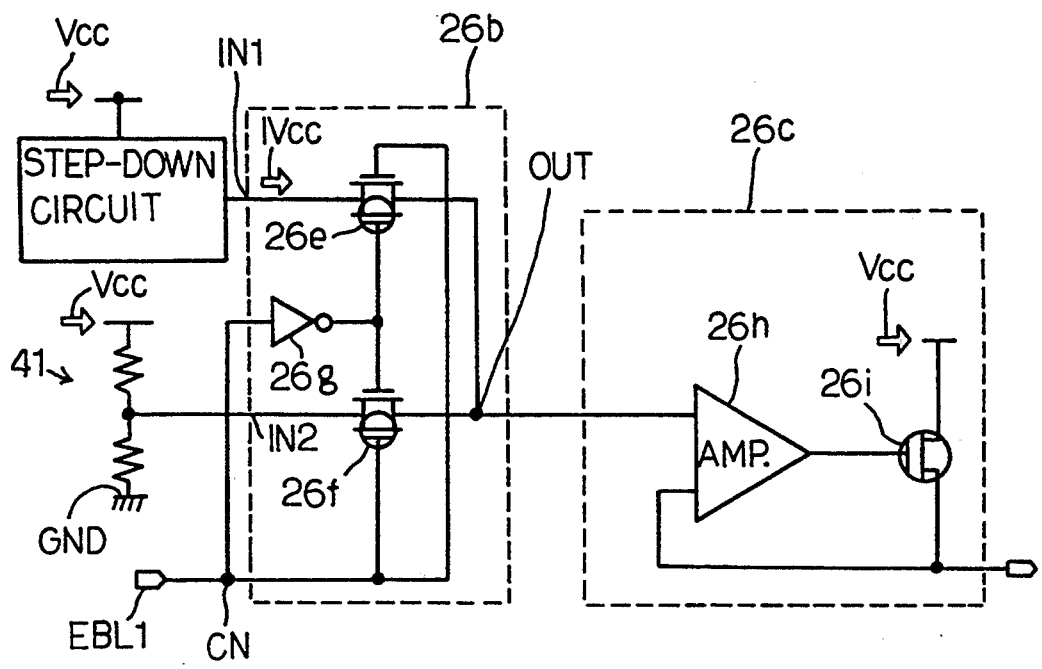
FIG. 6 is a circuit diagram showing a power distribution system incorporated in yet another dynamic random access memory device according to the present invention.

Turning to FIG. 6 of the drawings, a voltage divider 41 incorporated in another dynamic random access memory device embodying the present invention is connected between the external power voltage line Vcc and the ground voltage line GND. However, the other components are similar to those of the first embodiment, and description is not made on the other components for the sake of simplicity.

In the testing operation on the oscillator 27a, the external power voltage Vcc is applied to the voltage divider 41, and the voltage divider 41 produces a known step-down power voltage level from the known external power voltage level Vcc. If the voltage divider 41 is arranged in such a manner as to produce the known step-down power voltage equal to a target level of the step-down power voltage IVcc, the oscillation frequency is directly available for the laser trimming.

As will be appreciated from the foregoing description, the dynamic random access memory device according to the present invention allows the diagnostic system to check the oscillation frequency under application of the known power voltage, and the laser trimming can be carried out simultaneously on the oscillator and the step-down voltage generating circuit. As a result, only one laser trimming rescues the dynamic random access memory device from defect in the step-down voltage generating circuit and the oscillator, and the production cost is decreased.

Although particular embodiments of the present invention have been shown and described, it will be obvious to those skilled in the art that various changes and modifications may be made without departing from the spirit and scope of the present invention.

What is claimed is:

1. A dynamic random access memory device selectively entering a diagnostic mode, a standard mode for a data access and a refreshing mode, comprising:

a) a plurality of memory cells respectively assigned individual addresses, and respectively storing data bits in the form of electric charge;

b) an addressing system associated with said plurality of memory cells, and responsive to external address bits for selectively carrying out a read-out sequence and a write-in sequence on said plurality of memory cells in said standard mode;

c) a refreshing system associated with said plurality of memory cells, and operative to sequentially refresh said data bits stored in said plurality of memory cells through a refreshing sequence in said refreshing mode, said refreshing system having an oscillator operative to produce a pulse signal used for defining an interval of said refreshing sequence, a frequency of said pulse signal being detectable at the outside thereof and regulable in a first testing operation in said diagnostic mode; and d) a power distribution system having a voltage converter operative to produce a first power voltage with an unknown level from a second power voltage with a known level, and supplying said first power voltage level to at least said oscillator in said refreshing mode and said second power voltage to at least said oscillator in said first testing operation, the unknown level of said first power voltage being detectable and regulable through a second testing operation in said diagnostic mode.

2. A dynamic random access memory device as set forth in claim 1, in which said power distribution further has d-1) a switching unit having a first input node coupled with an output node of said voltage converter and a second input node supplied with said second power voltage, and operative to selectively couple said first and second input nodes with an output node thereof depending upon the mode of operation, and d-2) a buffer unit having a control node coupled with said output node of said switching unit and a power supply node supplied with said second power voltage, and operative to regulate a voltage level at an output node thereof to the voltage level at said control node.

3. A dynamic random access memory device as set forth in claim 2, in which said buffer unit comprises a differential amplifier circuit having said control node and a feedback node coupled with said output node, and a variable load transistor coupled between said power supply node and said output node and having a gate electrode coupled with an output node of said differential amplifier circuit.

4. A dynamic random access memory device as set forth in claim 1, in which said power distribution system further comprises a buffer unit having a control node coupled with an output node of said voltage converter and a power supply node supplied with said second power voltage, and operative to regulate a voltage level at an output node thereof to the first power voltage in said refreshing mode, and a power voltage line coupled between an external pin applied with said first power voltage and said output node of said buffer unit.

5. A dynamic random access memory device as set forth in claim 4, in which said buffer unit comprises a differential amplifier circuit having said control node and a feedback node coupled with said output node, and a variable load transistor coupled between said power supply node and said output node and having a gate electrode coupled with an output node of said differential amplifier circuit.

6. A dynamic random access memory device as set forth in claim 1, in which said power distribution system comprises d-1) a voltage divider supplied with said second power voltage for producing a third power voltage with a known level at an output node thereof, d-2) a switching unit having a first input node coupled with an output node of said voltage converter and a second input node coupled with said output node of said voltage divider, and operative to selectively couple said first and second input nodes with an output node thereof depending upon the mode of operation, and d-2) a buffer unit having a control node coupled with said output node of said switching unit and a power supply node supplied with said second power voltage, and operative to regulate a voltage level at an output node thereof to the voltage level at said control node.

7. A dynamic random access memory device as set forth in claim 6, in which said buffer unit comprises a differential amplifier circuit having said control node and a feedback node coupled with said output node, and a variable load transistor coupled between said power supply node and said output node and having a gate electrode coupled with an output node of said differential amplifier circuit.

* * * * *

UNITED STATES PATENT AND TRADEMARK OFFICE
CERTIFICATE OF CORRECTION

PATENT NO. : 5,337,282
DATED : August 9, 1994
INVENTOR(S) : Hiroki KOIKE

It is certified that error(s) appears in the above-identified patent and that said Letters Patent is hereby corrected as shown below:

Column 3, line 63, delete "17" and insert --11--;

line 67, delete "]2" and insert --12--.

Signed and Sealed this

Eighth Day of November, 1994

Attest:

BRUCE LEHMAN

Attesting Officer     Commissioner of Patents and Trademarks